United States Patent [19]

Dodds et al.

[11] Patent Number: 4,707,426
[45] Date of Patent: Nov. 17, 1987

[54] RADIATION EXPOSURE METHOD OF MANUFACTURING A COLOR CATHODE RAY TUBE HAVING LIGHT ABSORPTIVE AREAS

[75] Inventors: Robert E. Dodds, San Diego; David S. Goodwin, Poway; Himanshu M. Patel, Escondido, all of Calif.

[73] Assignee: Sony Corporation, Tokyo, Japan

[21] Appl. No.: 826,024

[22] Filed: Feb. 4, 1986

[51] Int. Cl.$^4$ ............................ G03C 5/00; H01J 9/227
[52] U.S. Cl. .................................... 430/25; 430/28; 430/29
[58] Field of Search ................... 430/25, 28, 29, 329, 430/330

[56] References Cited

U.S. PATENT DOCUMENTS

| | | | |
|---|---|---|---|
| 3,632,339 | 1/1972 | Khan | 430/25 |
| 3,639,185 | 2/1972 | Colom et al. | 430/330 |
| 3,917,794 | 11/1975 | Akagi et al. | 430/25 |
| 3,965,278 | 6/1976 | Duinker et al. | 430/6 |
| 4,015,986 | 4/1977 | Paal et al. | 430/329 |
| 4,041,347 | 8/1977 | Deal et al. | 427/64 |
| 4,086,090 | 4/1978 | Kohashi et al. | 430/28 |

Primary Examiner—Charles L. Bowers, Jr.
Attorney, Agent, or Firm—Hill, Van Santen, Steadman & Simpson

[57] ABSTRACT

A method for manufacturing a color cathode ray tube, and in particular, for conditioning the surface of a panel of a color cathode ray tube to prepare it for the application of a pattern of color phosphors while minimizing the effects of reflections from interfaces in the panel. The method consists of coating a reciprocity-failing photoresist layer on the inner surface of the panel, drying the layer with a stream of low dew point air, exposing the layer to actinic radiation through a patterned mask to provide insoluble polymerized areas in preselected portions of the layer, developing the layer with a developing solution to remove unpolymerized areas while leaving the polmerized areas, applying an aqueous suspension of light absorptive material to the panel to replace the developing solution with the light absorptive material, drying the light absorptive material, applying an oxidizing solution to the panel to cause the polymerized areas to become water soluble, and removing the polymerized areas and the light absorptive material before applying the phosphors.

10 Claims, 2 Drawing Figures

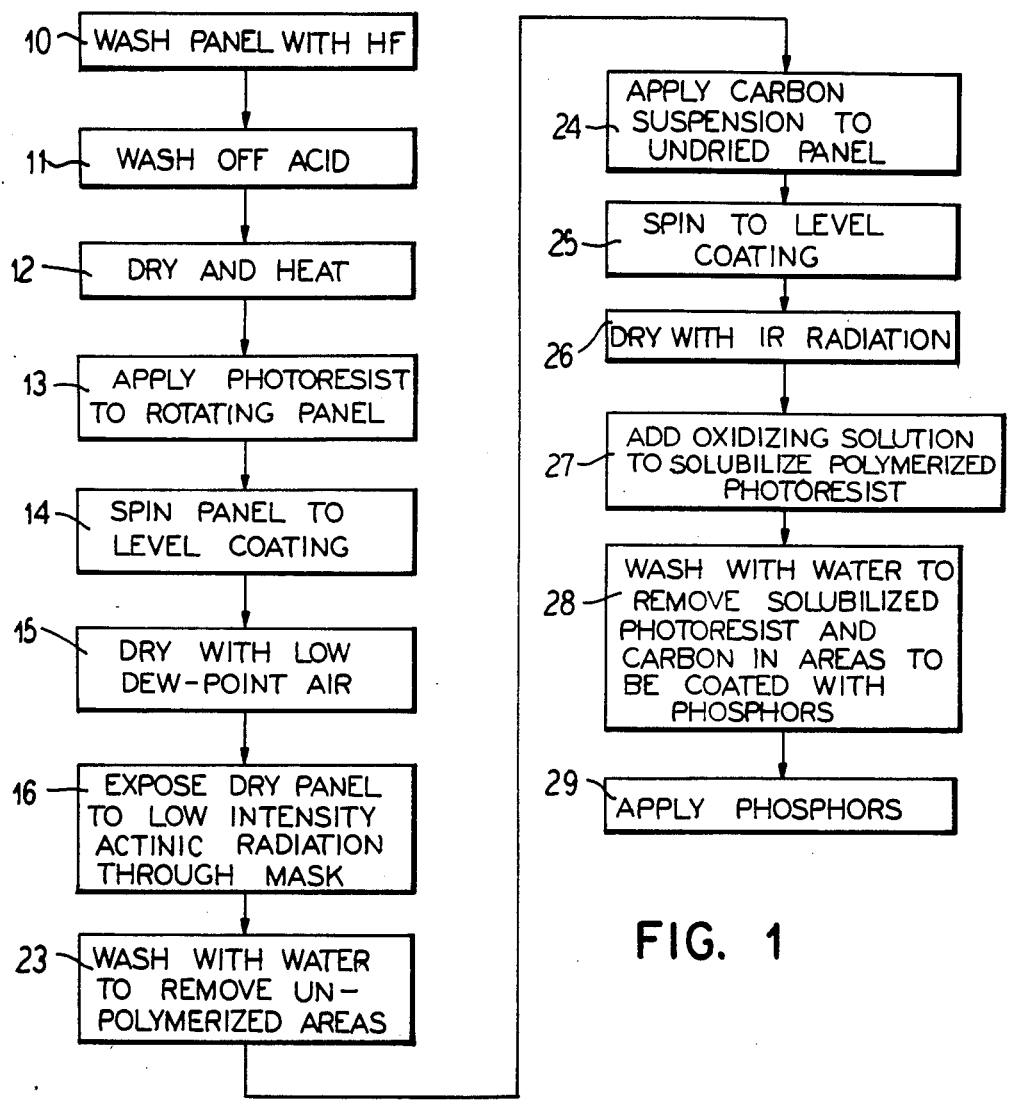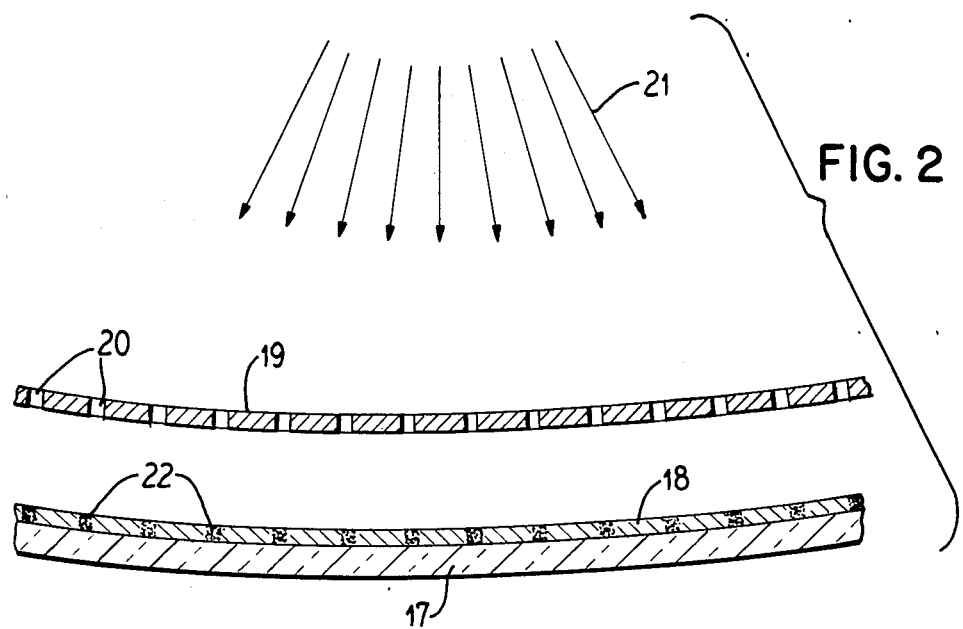

RADIATION EXPOSURE METHOD OF MANUFACTURING A COLOR CATHODE RAY TUBE HAVING LIGHT ABSORPTIVE AREAS

BACKGROUND OF THE INVENTION

1. Field of the Invention

The present invention is in the field of treating a panel of a color cathode ray tube to prepare the panel for phosphor deposition and concerns itself essentially with minimizing the effects of reflections from interfaces in the panel which set up standing waves and create abnormalities in the uniformity of the color phosphor patterns which are deposited.

2. Description of the Prior Art

In the usual process for manufacture of a color cathode ray tube, lithographic processes are employed using photoresist compositions which are light sensitive in that they polymerize in the presence of actinic radiation. In the past, photoresist solutions consisting essentially of polyvinyl alchohol (PVA) and ammonium dichromate (ADC) have been used by all cathode ray tube manufacturers as the photoresist coating. This coating was applied to the inside face of a cathode ray tube and dried by means of infrared radiation. A shadow mask was inserted and the dry photoresist layer was exposed to actinic light so as to simulate electron beams from the electron gun. The exposure to actinic light produces a cross-linking reaction between the PVA and ADC so as to increase the molecular weight of the photoresist in the exposed area. In the unexposed area, the resist remains water soluble. By washing the panel with water, the unexposed area is selectively removed. This leaves "hard" PVA stripes where the phosphor is to be deposited eventually. A suspension of carbon or graphite particles is then deposited on the inner surface, followed by drying. Reversal or removal of the "hard" PVA stripes is accomplished by using a solution of hydrogen peroxide, an alkali metal periodate or other oxidizing agent, followed by water washing.

One of the primary problems associated with the aforementioned prior art is that the PVA-ADC photoresist responds linearly to light energy. In U.S. Pat. Nos. 3,917,794 and 4,191,571, which are incorporated herein by reference, there are described systems employing photoresist materials having reciprocity failure in the manufacture of cathode ray tubes. The reciprocity failure, of course, is in the inability of the light sensitive material to compensate for unusually long or short exposures, i.e. the response becomes non-linear. In U.S. Pat. No. 3,917,794, there is disclosed a photoresist material composed of a high molecular weight compound and a cross-linking agent together with a binding promoter. In U.S. Pat. No. 4,191,571, the photoresist composition contains a water-soluble aromatic azide compound and a photo-cross-linkable water soluble polymer.

Processes described in the afore-mentioned patents are useful to achieve "print-down", which is the production of a hardened response in the photoresist layer which is smaller than the aperture of the mask through which the energizing light passes. They do not provide a process which will function on a fine pitch line tube which exhibits a standing wave pattern due to internal reflections.

In the case of a fine pitch (short Q space) cathode ray tube, light refraction and reflection patterns are formed when the panel is exposed to actinic radiation. These patterns result at the shadow mask slit edge, the air-photoresist interface, and the glass-air interface. The reflections and refractions cause additive and subtractive light patterns to be presented to the photoresist coating. Due to the linear response of the PVA-ADC photoresist of the prior art, the stripe width was reduced where the effect was subtractive and increased where it was additive. This phenomenon resulted in a series of vertical bars on the finished cathode ray tube of varying brightness instead of the desired uniform brightness.

The phenomena which makes the photoresist of the present invention effective for reducing or eliminating the effects of the reflected and/or refracted light is its intensity cutoff. This cuttoff results because the photoresist is cross-linked by a free radical process.

The following situations can occur when light strikes a free radical synthesizer of the stilbene type, such as 4, 4'-diazidostilbene-2, 2'-sodium disulfonate:

1. The stilbene molecule can absorb a photon and form a free radical which in turn can react with the water soluble polymer resulting in polymerization.

2. The stilbene molecule can absorb a photon and by forming resonance structures, dissipate the energy and show no chemical change.

3. The free radical formed in (1) above can react with oxygen, hydrogen, water, or the like to consume the free radical and form a non-reactive compound of low molecular weight.

4. In the case of a low energy photon, the stilbene molecule may not absorb the energy and no reaction will occur.

The side reactions set forth in paragraphs 2, 3 and 4 are what give the resist of the present invention its desirable properties.

It is clear that insufficient drying of the photoresist results in an increase of the terminating side reaction set forth in paragraph 3 above. If the panel temperature changes during exposure, the permeation of air and hydrogen through the photoresist coating will change, i.e. there will be increased permeation with increased temperature. This results in a change in the probability of a terminating side reaction such as reaction 3. The side reactions which result in producing the desired effect of the present invention are those stated in paragraphs 2 and 4.

Another disadvantage of the prior art is in the area of the reversal solution used to dissolve the polymerized film. The use of peroxides, hypochlorides, dichromates, or periodate solutions as oxidizing agents requires the use of hot solutions, usually about 60° C., and employing excessive times, on the order of 2 minutes. This makes processing a problem with respect to machine schedules and productivity. Also, the concentrations of the oxidizing agents used make them quite expensive. In the case of the peroxide and hypochloride oxidizing agents, containment is a major concern because if the vapors get into the air system of the screen room, adhesion problems will result on the subsequent phosphor applications and the photoprinting process.

SUMMARY OF THE INVENTION

The present invention provides a photoresist composition evidencing reciprocity failure so that the effect of reflected light from various sources on the polymerization process is minimized, so as to produce a major reduction in the light-dark area problem.

One of the features of the present invention provides for air drying of the photoresist layer which keeps the panel temperature at a level not in excess of about 32° C. Drying in the conventional process with heat results in a temperature of about 45° C. The room temperature at exposure is about 21° C. The side reactions which produce reciprocity failure are all dependent on temperature. It is well known that the lower the temperature differential between an object's temperature and its surroundings, the less rapid change will occur. For this reason, the improved air drying system of the present invention using a low dew point air provides a much improved reaction rate stability with time than does a drying system employing elevated temperatures. The dew point of the drying air in accordance with the present invention is not in excess of about −20° C.

Because the area between the polymerized stripes is very small, being on the order of about 30 microns, it is important that the carbon suspension possess excellent wetting quality. By not drying the panel as proposed in the present application, the carbon suspension need only replace the water in the striped areas. There is another advantage in that it is easier to replace similar solutions on an already wetted surface than it is to wet a completely dry surface.

The preferred reversal solution of the present invention is an alkaline solution of potassium permanganate. The oxidizing solution is applied at a temperature less than about 40° C. The oxidizing (reversal) solution is much faster and more efficient than those normally used. The permangante solution requires only 20-30 seconds of contact as a rule, whereas a peroxide and other reversing solutions require about 120 seconds. Solution concentration for the permanagante can be considerably lower than the solution concentrations for oxidizing agents of the past which frequently ran about 5% or so. This system eliminates the problems of free vapors in the process. Because of the relatively low concentrations, the cost is much lower than the solutions of the prior art. Furthermore, the permanganate reversal solution reduces the cycle and productivity problems present when using prior art solutions.

BRIEF DESCRIPTION OF THE DRAWINGS

To illustrate the invention more completely, reference is invited to the attached sheet of drawings in which:

FIG. 1 is a block diagram comprising a flow chart of the process involved; and

FIG. 2 is a view partly in elevation and partly in cross-section on a greatly magnified scale illustrating the exposure of the photoresist layer, the spacings and the dimensions being exaggerated for purposes of clarity.

DESCRIPTION OF THE PREFERRED EMBODIMENTS

The present invention will be described in conjunction with the preparation of a glass, curved panel which forms the face of a color cathode ray tube. It is this type of structure that provides difficulties due to reflection and refraction, thereby providing standing waves from the impinging light resulting in discrepancies in color quality in the finished tube.

In the first step of the process illustrated at reference numeral 10 in FIG. 1, a glass cathode ray tube panel is washed using a 4% HF solution at room temperature. This cleans the surface and etches it slightly to make it receptive to subsequently applied layers. In the second step, indicated at reference numeral 11, the acid is washed off by repeated applications of water. Next, the panel is dried and heated to about 35° C. with infrared radiation, this step being illustrated at reference numeral 12.

Then, the improved photoresist composition is applied while the panel is being rotated, as set forth in step 13. The improved photoresist formulation of the present invention contains a ratio of about 5-20 parts by weight of polyvinyl pyrrolidone (PVP) to one part by weight of 4, 4'-diazidostilbene-2, 2' sodium disulfonate. As a typical example, a stock solution was made up consisting of the following:

240 g polvinyl pyrrolidone
24 g 4.4' diazidostilbene - 2,2' - sodium disulfonate
41 g deionized water The above solution was adjusted to a solids concentration of 6% by weight and used as a feed solution for further dilutions.

The coating solution was made up from the stock solution as follows:

417 g stock solution
433 ml deionized water
150 ml methanol (reagent grade)
2 ml of a 10% solution of a non-ionic surfactant ("Triton x -100')

This solution contained 2.5% solids with a viscosity of 15 cps at 21° C., and had a surface tension of 37 dynes/cm$^2$.

The above photoresist solution was applied to a rotating panel, as mentioned, and then the coated panel was spun as indicated at reference numeral 14 to level the coating to about 1 micron thickness. Next, the photoresist coating was dried using a low dew point air of about −80° C. dew point. This step is indicated with reference numeral 15.

The next step identified at reference numeral 16 in FIG. 1 is best illustrated at FIG. 2 of the drawings. As shown, a curved glass panel 17 has a very thin layer 18 of the photoresist coating on it. A mask 19 having a pattern of apertures therein such as long narrow slits 20 is interposed between the photosensitive surface of the photoresist coating 18 and a source of actinic radiation generally illustrated at reference numeral 21. The rays passing through the slits 20 and impinging on the photoresist coating 18 cause a pattern or grid work of hardened coating to occur in the photoresist coating 18 due to polymerization, these hardened portions of the coating being illustrated at reference numeral 22.

Returning to FIG. 1, the next step identified by reference numeral 17 consists in washing the exposed panel with a developer, in this case water, to remove the unpolymerized areas between the hardened portions.

The next step 24 consists in applying a suspension of carbon particles such as graphite particles onto the panel while the panel is still wet with water from the development process. Such graphite suspensions are commonly used in the production of black matrix tubes. The panel is spun to level the carbon coating as set forth in step 25 after which it is dried with infrared radiation identified at reference numeral 26.

The next step consists in applying the reversal solution which in the preferred form of the invention is an alkaline solution of potassium permanganate. Typically, the reversal solution can be made up as follows:

2.5 g potassium permanganate
0.5 g sodium hydroxide 1000 ml deionized water

Other oxidizing solutions, such as hydrogen peroxide, hypochlorites, or alkali metal periodates can also be used but they require higher temperatures and longer treatment times.

The oxidizing reversal solution is applied to solubulize the polymerized photoresist areas as indicated by step 27. Next, the panel is washed with water to remove the photoresist and the carbon in the areas to be coated with phosphors. This step has been identified as reference numeral 28. Finally, the phosphors are applied in step 29 in accordance with the usual deposition techniques for the red, green and blue primary phosphor colors.

The improved phosphor of the invention reduces or eliminates the effect of reflected and/or refracted light arising from the various interfaces in the tube, or by reflection from the curved surfaces.

The method of the present invention thereby provides a convenient and inexpensive means for producing a carbon matrix for a fine pitch line type cathode ray tube, which was heretofore extremely difficult to carry out.

It should be evident that various modifications can be made to the described embodiments, without departing from the scope of the present invention.

We claim as our invention:

1. A process of applying a light absorptive material to the surface of a panel of a color cathode ray tube prior to receiving a pattern of color phosphors which comprises:

coating a reciprocity-failing photoresist composition including a bisazide having a linking stilbene group onto the inner surface of said panel to form a photoresist layer, drying the resulting layer with a stream of air having a dewpoint not in excess of about −20° C., exposing said layer to actinic radiation wherein said radiation passes through a mask leaving a pattern which blocks portions of said radiation to provide insoluble polymerized areas in those areas which receive said radiation, developing the exposed layer with a developing solution to remove unpolymerized areas while leaving the polymerized areas of said layer on said panel, immediately after developing, and without drying the previously wetted surface, coating the entire panel containing said polymerized areas with aqueous suspension of light absorptive material, drying the coating of light absorptive material, and removing the polymerized areas and light absorptive material overlying the polymerized areas thereby leaving the light absorptive material in areas where unpolymerized areas were once located on said panel.

2. A method according to claim 1 wherein said polymerized areas are removed with an aqueous alkaline solution of potassium permanganate.

3. A method according to claim 2 wherein said oxidizing solution contains from 0.05 to 0.5% by weight potassium permanganate.

4. A method according to claim 2 wherein said solution is in contact with said panel for a period of about 20 to 30 seconds.

5. A method according to claim 1 wherein the layer during drying with said stream of low dew point air does not exceed a temperature of about 32° C.

6. A method according to claim 1 wherein the temperature of said oxidizing solution is less than about 40° C.

7. A method according to claim 1 wherein a portion of said panel is curved to thereby provide standing waves therealong upon reflection of impinging light.

8. A method according to claim 1 wherein said light absorptive material is carbon.

9. A method according to claim 1 wherein said developing solution is water.

10. A method according to claim 1 wherein said photoresist is a mixture of polyvinyl pyrrolidone and 4, 4′-diazidostilbene-2, 2′ sodium disulfonate.

* * * * *